United States Patent
Lee

(10) Patent No.: US 7,053,686 B2
(45) Date of Patent: May 30, 2006

(54) DATA STROBE CIRCUIT USING CLOCK SIGNAL

(75) Inventor: Kang Youl Lee, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 14 days.

(21) Appl. No.: 10/879,300

(22) Filed: Jun. 30, 2004

(65) Prior Publication Data

US 2005/0134340 A1 Jun. 23, 2005

(30) Foreign Application Priority Data

Dec. 23, 2003 (KR) ...................... 10-2003-0095305

(51) Int. Cl.
*H03K 19/00* (2006.01)
(52) U.S. Cl. ........................................ 327/198; 326/93
(58) Field of Classification Search .................. 327/65, 327/172, 198; 326/14, 93
See application file for complete search history.

(56) References Cited

U.S. PATENT DOCUMENTS

| 6,034,916 | A | 3/2000 | Lee |
| 6,288,577 | B1 * | 9/2001 | Wong ........................... 327/65 |
| 6,314,050 | B1 | 11/2001 | Yi et al. |
| 6,381,194 | B1 | 4/2002 | Li |
| 6,498,766 | B1 | 12/2002 | Lee et al. |
| 6,615,345 | B1 | 9/2003 | LaBerge |
| 6,671,211 | B1 | 12/2003 | Borkenhagen et al. |
| 6,728,144 | B1 | 4/2004 | Nygren |
| 6,753,701 | B1 * | 6/2004 | Chang .......................... 326/93 |
| 2004/0037135 | A1 | 2/2004 | Morzano |

FOREIGN PATENT DOCUMENTS

| JP | 10-199239 | 7/1998 |
| JP | 2002-025261 | 1/2002 |

* cited by examiner

*Primary Examiner*—Dinh T. Le
(74) *Attorney, Agent, or Firm*—Heller Ehrman LLP

(57) ABSTRACT

A data strobe circuit is configured to generate an internal strobe signal for latching data in response to a clock signal. The data strobe circuit using a clock signal comprises an external input processing unit, a clock signal processing unit and a strobe signal output unit. The external input processing unit performs a logic operation on an externally applied data strobe signal and a reference voltage, and outputs the result of the logic operation in response to a clock enable signal and an internal control signal. The clock signal processing unit selectively outputs an external clock signal in response to the clock enable signal. The strobe signal output unit performs a logic operation on output signals from the external input processing unit and the clock signal processing unit, and selectively outputs one of the output signals from the external input processing unit and the clock signal processing unit as an internal data strobe signal.

7 Claims, 3 Drawing Sheets

DATA STROBE CIRCUIT USING CLOCK SIGNAL

BACKGROUND OF THE INVENTION

1. Field of the Invention

The present invention generally relates to a data strobe circuit, and more specifically, to an improved data strobe circuit for generating an internal strobe signal not by a data strobe signal applied externally but by a clock signal in a wafer test, thereby testing the larger number of chips at a wafer state simultaneously.

2. Description of the Prior Art

Recently, the main issue of the semiconductor memory field has been in a transition from integration to the operation speed. As a result, high speed synchronous memories such as a DDR SDRAM (Double Data Rate Synchronous DRAM) and a RAMBUS DRAM has been focused as a new issue in the semiconductor memory field.

The synchronous memory which refers to a memory operated synchronously with respect to an external system clock includes a SDRAM which leads the current mass production memory market of DRAMs. The SDRAM performs once data access at every clock by synchronizing input/output operations with respect to a rising edge of the clock. However, the high speed synchronous memory such as a DDR SDRAM performs twice data access at every clock by synchronizing input/output operations with respect to a falling edge as well as to a rising edge.

FIG. 1 is a circuit diagram illustrating a conventional data strobe circuit for generating an internal data strobe signal in a data input path.

The conventional data strobe circuit of FIG. 1 comprises comparators 101 and 102, NAND gates 103 and 104, and an AND gate 105. The comparator 101 compares a reference voltage VREF with a data strobe signal LDQS (or UDQS) applied externally. The comparator 102 compares the data strobe signal LDQS (or UDQS) with a signal LDQSB (or UDQSB) obtained by inverting the signal LDQS (or UDQS). The NAND gate 103 selectively outputs an output signal from the comparator 101 in response to an internal control signal EN_SGL. The NAND gate 104 selectively outputs an output signal from the comparator 102 in response to an internal control signal EN_DBL. The AND gate 105 performs an AND operation on output signals from the NAND gates 103 and 104, and outputs an internal strobe signal STROBE. Here, the data strobe signal LDQS(Low DQS) represents a signal having a predetermined low bit from the whole data strobe signals applied externally. The internal control signals EN_SGL and EN_DBL are to control generation of the internal strobe signal STROBE so that one of the output signals from the comparators 101 and 102 may be outputted as the internal strobe signal STROBE or the internal strobe signal STROBE is outputted by combination of the output signals.

The above-described conventional data strobe circuit requires external input signals such as the data strobe signals LDQS and LDASB applied externally for generation of the internal strobe signal STROBE for data latch.

However, when a large amount of memory devices are tested at a wafer state before the memory devices are packaged, the number of pins which can be tested simultaneously is determined by the physical restriction of measurement equipment. As a result, the large amount of chips cannot be tested at the same time due to the restriction of the number of pins in the conventional memory device which requires external input signals such as the data strobe signals LDQS and LDQSB and the reference voltage VREF to generate the internal strobe signal STROBE.

SUMMARY OF THE INVENTION

Accordingly, it is an object of the present invention to provide a data strobe circuit for generating an internal strobe signal for latching data in a test mode not by externally applied data latch input signals such as LDQS, LDQSB and VREF but by a reference clock signal CLK of a memory device, thereby reducing the number of pins required to test each memory device to measure a larger number of chips simultaneously.

In a first embodiment, a data strobe circuit using a clock signal comprises an external input processing unit, a clock signal processing unit and a strobe signal output unit. The external input processing unit performs a logic operation on an externally applied data strobe signal and a reference voltage, and outputs the result of the logic operation in response to a clock enable signal and an internal control signal. The clock signal processing unit selectively outputs an clock signal in response to the clock enable signal. The strobe signal output unit performs a logic operation on output signals from the external input processing unit and the clock signal processing unit, and selectively outputs one of the output signals from the external input processing unit and the clock signal processing unit as an internal data strobe signal.

In a second embodiment, a data strobe circuit using a clock signal comprises an external input processing unit and a clock signal processing unit. The external input processing unit performs a logic operation on an externally applied data strobe signal and a reference voltage, and outputs the result of the logic operation as an internal strobe signal in response to the internal control signal when the clock enable signal is inactivated. The clock signal processing unit outputs the clock signal as the internal strobe signal when the clock enable signal is activated.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 2:
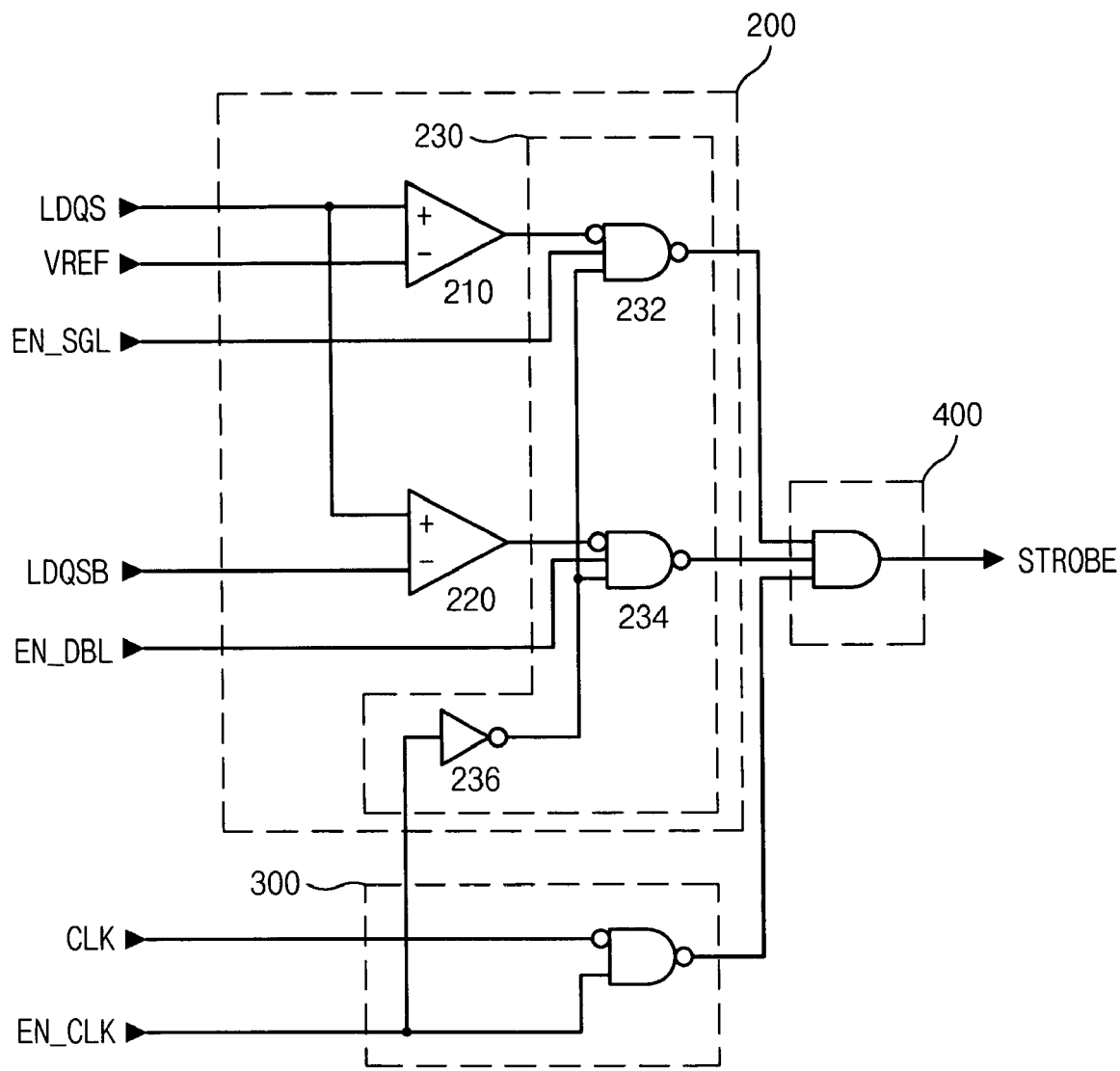
FIG. 2 is a circuit diagram illustrating a data strobe circuit using a clock signal according to a first embodiment of the present invention.

FIG. 2 is a circuit diagram illustrating a data strobe circuit using a clock signal according to a first embodiment of the present invention.

In an embodiment, the data strobe circuit comprises an external input processing unit 200, a clock signal processing unit 300 and a strobe signal output unit 400.

The external input processing unit 200 performs a logic operation on data strobe signals LDQS and LDQSB applied externally and a reference voltage VREF, and selectively outputs the result of the logic operation in response to internal control signals EN_SGL and EN_DBL and a clock enable signal EN_CLK. The external input processing unit 200 comprises a first comparison unit 210, a second comparison unit 220 and a selective output unit 230. Here, the clock enable signal EN_CLK which controls generation of the internal strobe signal STROBE in response to a clock signal CLK in a test mode is activated in the test mode and inactivated in a normal mode.

The first comparison unit 210 compares the data strobe signal LDQS with the reference voltage VREF, and outputs the result of the comparison. Here, the first comparison unit 210 comprises a comparator for comparing the level of the data strobe signal LDQS with that of the reference voltage VREF.

The second comparison unit 220 compares the data strobe signal LDQS with a signal LDQSB obtained by inverting the signal LDQS. Here, the second comparison unit 220 comprises a comparator for comparing the level of the data strobe signal LDQS with that-of the signal LDQSB.

The selective output unit 230 selectively outputs output signals from the first comparison unit 210 and the second comparison unit 220 to the strobe signal output unit 400 in response to the clock enable signal EN_CLK and the internal control signal EN_SGL and EN_DBL. Here, the selective output unit 230 comprises 3 input NAND gates 232 and 234, and an inverter 236.

The 3 input NAND gate 232 performs a NAND operation on the output signal from the first comparison unit 210, the internal control signal EN_SGL and a signal /EN_CLK obtained by inverting the clock enable signal, and outputs the result of the operation to the strobe signal output unit 400. The 3 input NAND gate 234 performs a NAND operation on a signal obtained by inverting the output signal from the second comparison unit 220, the internal control signal EN_DBL and the inverted clock enable signal /EN_CLK, and outputs the result of the operation to the strobe signal output unit 400. The inverter 236 inverts the clock enable signal EN_CLK, and outputs the inverted signal to the 3 input NAND gates 232 and 234.

The clock signal processing unit 300 selectively outputs the clock signal CLK which is a base of the internal memory device in response to the clock enable signal EN_CLK. The clock signal processing unit 300 comprises a NAND gate for performing a NAND operation on the clock enable signal EN_CLK and a signal obtained by inverting the clock signal CLK.

The strobe signal output unit 400 performs a logic operation on output signals from the external input processing unit 200 and the clock signal processing unit 300, and outputs one of the output signals from the external input processing unit 200 and the clock signal processing unit 300 as the internal data strobe signal STROBE for latching data. The strobe signal output unit 400 comprises a 3 input AND gate for performing an AND operation on output signals from the 3 input NAND gates 232 and 234 and clock signal processing unit 300. Although the strobe signal output unit 400 is embodied as an AND gate in FIG. 1, a NAND gate is actually connected in serial to an inverter.

Hereinafter, the operation of the data strobe circuit of FIG. 2 is described.

Figure 1:
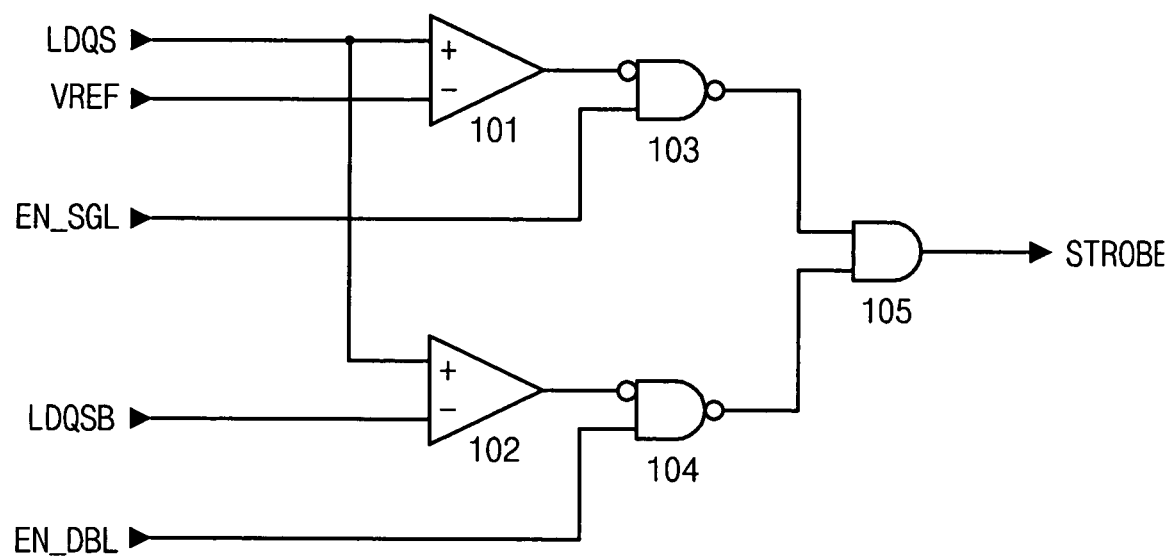
FIG. 1 is a circuit diagram illustrating a conventional data strobe circuit for generating an internal data strobe signal in a data input path.

When the strobe circuit of FIG. 2 is compared with that of FIG. 1, the output signal from the comparator 101 for comparing the data strobe signal LDQS with the reference voltage VREF is transmitted from the NAND gate 103 to the AND gate 105 in response to the control signal EN_SGL in FIG. 1. However, the output signal from the first comparison unit 210 is transmitted from the NAND gate 232 to the strobe signal output unit 400 in response to the inverted clock enable signal /EN_CLK as well as to the control signal EN_SGL.

In other words, the output signal from the first comparison unit 210 is not transmitted to the strobe signal output unit 400 if the clock enable signal EN_CLK is activated, and does not affect generation of the internal strobe signal STROBE.

In the same way, the output signal from the second comparison unit 220 is not transmitted to the strobe signal output unit 400 if the clock enable signal EN_CLK is activated, and does not affect generation of the internal strobe signal STROBE.

In the test mode, if the clock enable signal EN_CLK is activated, the selective output unit 230 does not outputs the output signals from the first comparison unit 210 and the second comparison unit 220 by the inverted clock enable signal /EN_CLK but outputs only a signal of 'high' to the strobe signal output unit 400. On the other hand, the clock signal processing unit 300 outputs the clock signal CLK to the strobe signal output unit 400 if the clock enable signal EN_CLK is activated. In this way, since the output signal from the external input processing unit 200 is maintained at a high level and the clock signal processing unit 300 outputs the clock signal CLK in the test mode, the strobe signal output unit 400 outputs the clock signal CLK as the internal strobe signal STROBE.

In a normal mode, the clock enable signal EN_CLK is inactivated, and the output signal from the clock signal processing unit 300 is maintained at a high level. On the other hand, the external input processing unit 200 selectively outputs the output signals from the first comparison unit 210 or the second comparison unit 220 in response to the internal control signals EN_SGL and EN_DBL. As a result, the strobe signal output unit 400 outputs one of the output signals from the first comparison unit 210 and the second comparison unit 220 as the internal strobe signal STROBE like in FIG. 1.

As described above, the data strobe circuit of FIG. 2 is configured to generate the internal strobe signal in response not to the internal data strobe signals LDQS and LDQSB and the reference voltage VREF but to the clock signal CLK in the test mode. Accordingly, since the number of pins required in each chip is reduced in a memory test, the larger number of memory chips can be tested simultaneously.

Figure 3:
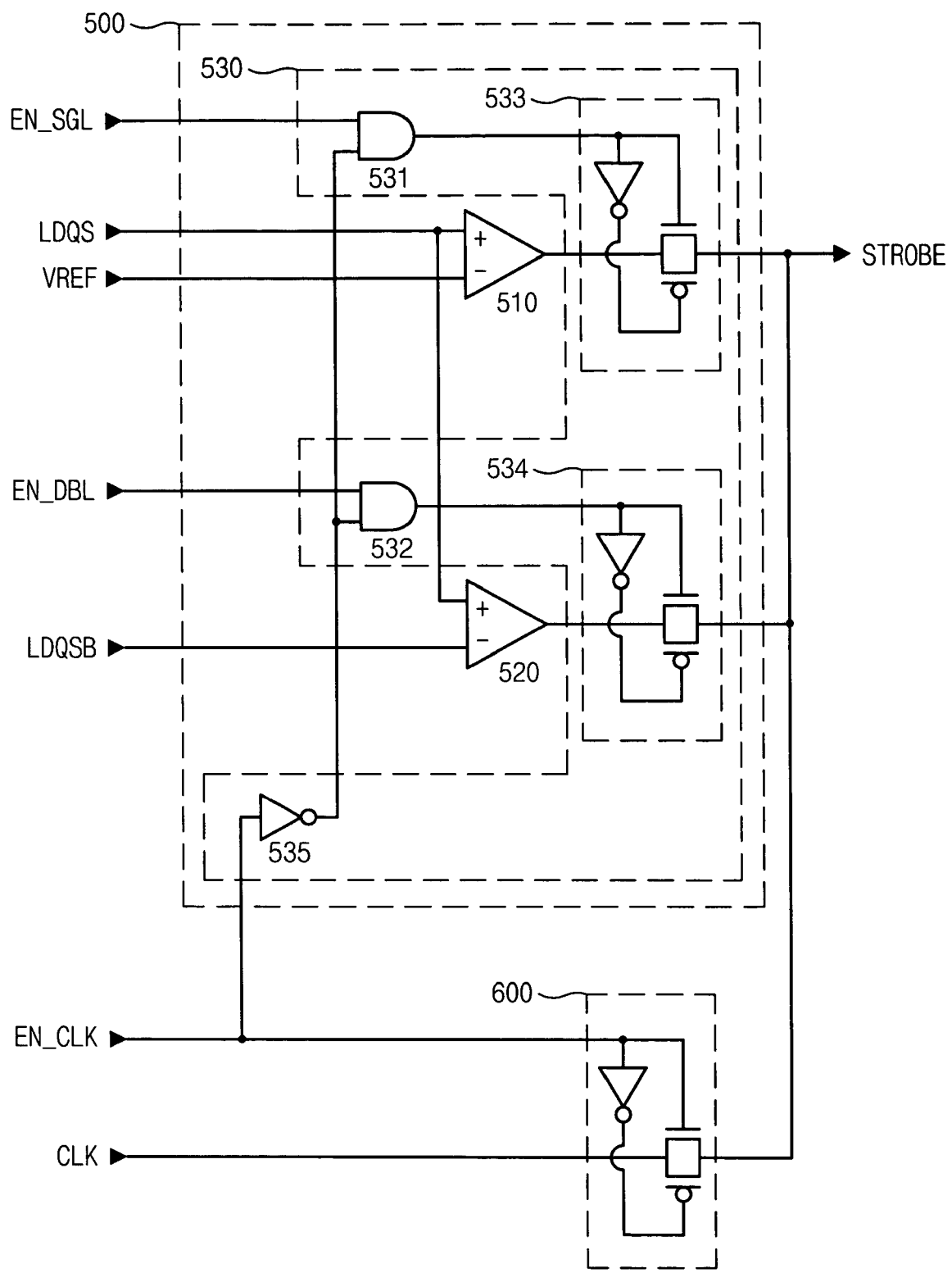
FIG. 3 is a circuit diagram illustrating a data strobe circuit using a clock signal according to a second embodiment of the present invention.

FIG. 3 is a circuit diagram illustrating a data strobe circuit using a clock signal according to a second embodiment of the present invention.

The data strobe circuit of FIG. 3 comprises an external input processing unit 500 and a clock signal processing unit 600.

The external input processing unit 500 performs a logic operation on data strobe signals LDQS and LDQSB applied externally and a reference voltage VREF, and outputs the result of the logic operation as an internal strobe signal STROBE in response to internal control signals EN_SGL and EN_DBL when a clock enable signal EN_CLK is inactivated. Here, the external input processing unit 500 comprises a third comparison unit 510, a fourth comparison unit 520 and a selective output unit 530.

The third comparison unit 510 compares the data strobe signal LDQS with the reference voltage VREF, and outputs the result of the comparison. Here, the third comparison unit 510 comprises a comparator for comparing the level of the data strobe signal LDQS with that of the reference voltage VREF.

The fourth comparison unit 520 compares the data strobe signal LDQS with a inverted data strobe signal LDQSB, and outputs the result of the comparison. Here, the fourth comparison unit 520 comprises a comparator for comparing the data strobe signals LDQS and LDQSB.

When the clock enable signal is inactivated, the selective output unit 530 transmits an output signal from the third comparison unit 510 or the fourth comparison unit 520 as the internal strobe signal in response to the internal control signals LDQS and LDQSB. Here, the selective output unit 530 comprises AND gates 531 and 532, transmission gates 533 and 534, and an inverter 535.

The AND gate 531 performs an AND operation on the internal control signal EN_SGL and a inverted clock enable signal /EN_CLK. The AND gate 532 performs an AND operation on the internal control signal EN_DBL and the inverted clock enable signal /EN_CLK. The transmission gate 533 selectively transmits the output signal from the third comparison unit 510 in response to an output signal from the AND gate 531, and outputs the internal strobe signal STROBE. The transmission gate 534 selectively transmits the output signal from the fourth comparison unit 520 in response to an output signal from the AND gate 532, and outputs the internal strobe signal STROBE. The inverter 535 inverts the clock enable signal EN_CLK, and outputs the inverted signal to the AND gates 531 and 532.

When the clock enable signal EN_CLK is activated, the clock signal processing unit 600 outputs the clock signal which is a base of the internal memory device as the internal strobe signal STROBE. Here, the clock signal processing unit 600 comprises a transmission gate turned on/off in response to the clock enable signal EN_CLK and for transmitting the clock signal CLK as the internal strobe signal STROBE.

Hereinafter, the operation of the data strobe circuit of FIG. 3 is described.

In the test mode, if the clock enable signal EN_CLK is activated, the output signals from the AND gates 531 and 532 are maintained at a low level. As a result, the transmission gates 533 and 534 are kept off, and the output signals from the third comparison unit 510 and the fourth comparison unit 520 are not transmitted as the internal strobe signal STROBE. On the other hand, the activation of the clock enable signal EN_CLK turns on only the transmission gate 600, and the clock signal CLK is transmitted as the internal strobe signal STROBE.

In the normal mode, if the clock enable signal EN_CLK is inactivated, the transmission gate 600 is turned off, thereby disconnecting the transmission of the clock signal CLK. On the other hand, the output signals from the AND gates 531 and 532 are selectively activated in response to the internal control signals EN_SGL and EN_DBL respectively, thereby selectively turning on the transmission gates 533 and 534. As a result, one of the output signals from the third comparison unit 510 and the fourth comparison unit 520 is selectively outputted as the internal strobe signal STROBE.

As discussed earlier, a data strobe circuit according to an embodiment of the present invention is configured to generate an internal strobe signal in response to a clock signal in a test mode, thereby reducing the number of pins required in each chip in a memory test to perform a test on the larger number of memory chips simultaneously.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A data strobe circuit using a clock signal, comprising:
an external input processing unit for performing a logic operation on an externally applied data strobe signal and a reference voltage, and outputting a result of the logic operation in response to a clock enable signal and an internal control signal;
a clock signal processing unit for selectively outputting an external clock signal in response to the clock enable signal; and
a strobe signal output unit for performing a logic operation on output signals from the external input processing unit and the clock signal processing unit, and selectively outputting one of the output signals from the external input processing unit and the clock signal processing unit as an internal data strobe signal.

2. The circuit according to claim 1, wherein the external input processing unit transmits the result of the logic operation to the strobe signal output unit in response to the internal control signal when the clock enable signal is inactivated, and the clock signal processing unit transmits the clock signal to the strobe signal output unit when the clock enable signal is activated.

3. The circuit according to claim 2, wherein the external input processing unit comprises:
a first comparison unit for comparing the data strobe signal with the reference voltage;
a second comparison unit for comparing the data strobe signal with an inversion of the data strobe signal; and
a selective output unit for selectively transmitting output signals from the first comparison unit and the second comparison unit in response to the internal control signal when the clock enable signal is inactivated.

4. The circuit according to claim 3, wherein the selective output unit comprises:
a signal inverting unit for inverting the clock enable signal;
a first selective output unit for transmitting the output signal from the first comparison unit to the strobe signal output unit in response to an output signal from the signal inverting unit and the internal control signal; and
a second selective output unit for transmitting the output signal from the second comparison unit to the strobe signal output unit in response to the output signal from the signal inverting unit and the internal control signal.

5. A data strobe circuit using a clock signal, comprising:
an external input processing unit for performing logic operation on an externally applied data strobe signal and a reference voltage, and transmitting a result of the logic operation in response to an internal control signal when an externally applied clock enable signal is inactivated; and a clock signal processing unit for transmitting an external clock signal when the clock enable signal is activated, wherein the result of the logic operation from the external input processing unit or the external clock signal from clock signal processing unit is selected by an output unit as an internal strobe signal.

6. The circuit according to claim 5, wherein the external input processing unit comprises:

a first comparison unit for comparing the data strobe signal and the reference voltage;

a second comparison unit for comparing the data strobe signal with an inversion of the data strobe signal; and a selective output unit for selectively transmitting one of output signals from the first comparison unit and the second comparison unit in response to an internal control signal when the clock enable signal is inactivated.

7. The circuit according to claim 5, wherein the clock signal processing unit is a transmission gate turned on/off in response to the clock enable signal and for selectively transmitting the external clock signal.

* * * * *